United States Patent [19]

Hoskinson

[11] 4,207,792
[45] Jun. 17, 1980

[54] TRI-STATE ENCODING CIRCUIT FOR ELECTRONIC MUSICAL INSTRUMENT

[75] Inventor: William R. Hoskinson, Elburn, Ill.

[73] Assignee: The Wurlitzer Company, DeKalb, Ill.

[21] Appl. No.: 37,687

[22] Filed: May 10, 1979

[51] Int. Cl.² .................. G10H 1/00; H03K 17/60; H03K 19/08

[52] U.S. Cl. .................. 84/1.01; 84/DIG. 10; 84/DIG. 23; 307/205; 307/209; 307/251; 328/205; 340/365 S

[58] Field of Search .............. 84/1.01, 1.1, DIG. 10, 84/DIG. 23; 307/205, 209, 251, 304, ; 328/205; 340/365 S

[56] References Cited

U.S. PATENT DOCUMENTS

| | | | |
|---|---|---|---|
| 3,969,633 | 7/1976 | Paluck et al. | 307/205 |
| 4,010,385 | 3/1977 | Krol | 307/251 X |
| 4,029,971 | 6/1977 | Pryor | 307/209 |
| 4,031,410 | 6/1977 | Kikuchi | 307/209 |
| 4,067,253 | 1/1978 | Wheelwright et al. | 84/1.1 |
| 4,100,429 | 7/1978 | Adachi | 307/205 |
| 4,115,706 | 9/1978 | Yamaguchi | 307/209 |

Primary Examiner—S. J. Witkowski
Attorney, Agent, or Firm—Trexler, Wolters, Bushnell & Fosse Ltd.

[57] ABSTRACT

A tri-state encoding circuit for use with an electronic musical instrument encodes one of three possible states of a device such as a switch, utilizing only a single input line from that device. The tri-state encoding circuit includes, in the case of a single-pole, double-throw switch, a first signal source which feeds signals of like frequency and duty cycle, but 180° out of phase to the respective fixed contacts of the switch. A first gating element is interposed between a source of biasing signal and the movable contact of the switch. Second and third gating elements receive control signals from a further signal source, these control signals being of like frequency and duty cycle but 180° out of phase. These second control signals are also of the same frequency as the first control signals, but may have a different duty cycle. The second and third gating elements are responsive to these control signals for controlling application of the signal on the movable contact to first and second associated outputs.

13 Claims, 5 Drawing Figures

TRI-STATE ENCODING CIRCUIT FOR ELECTRONIC MUSICAL INSTRUMENT

BACKGROUND OF THE INVENTION

This invention is directed generally to encoding circuits and more particularly to a tri-state encoding circuit for an electronic musical instrument.

Various tri-level or "tri-state" sensing or encoding circuits have been proposed in the prior art for various functions. Basically, such a circuit is useful in developing a signal which may be transmitted over a single line, and yet contain sufficient information to derive three distinguishable signals. For example, in an electronic musical instrument of the keyboard variety, each key may have one of three possible positions or states: unplayed or "up," played or "down," and in "transition" or between the "up" and "down" positions. In developing a percussion-type voice from such an instrument, e.g., a piano voice, it is useful to determine the position of a key at any given time, in order to develop a suitable signal indicative of the intensity of actuation of the key. In this regard, in order to electronically simulate the sound of a conventional piano, for example, it is desirable to develop a signal corresponding to the intensity of actuation of a key, since the intensity of actuation of a piano key effects the sound and tonal quality of the note played.

Accordingly, it will be seen that a signal having three states, corresponding to the three possible positions or states of a key-actuated switch may readily be utilized to develop a signal indicative of intensity of actuation of the associated key. For example, the signal may be utilized to turn on and turn off various clocks, counters or the like. Such a system is shown, for example, in Wheelwright et al U.S. Pat. No. 4,067,253.

Advantageously, the ability to develop such a tri-state signal using but a single line from the associated key-operated switch to internal musical instrument circuits results in great savings, as the number of lines required to be physically wired into the keyboard are reduced by one-half. In this regard, it will be recognized that conventional practice would call for a separate wire from the keyboard of the instrument for each fixed contact of each key switch, thereby requiring at least two wires per switch. With the provision of suitable encoding circuitry, however, only a single wire from the movable contact of each key switch need be utilized.

While various arrangements, including the aforementioned U.S. Pat. No. 4,067,253, have been proposed for producing such a signal, the present invention provides a novel and improved tri-state encoder circuit for this purpose. Advantageously, the circuit of the present invention utilizes signal sources already available in the electronic musical instrument and further utilizes but a minimum of components to develop the suitable encoded signals. Moreover, the components utilized in the present invention are of a type which may be readily realized as a part of a large scale integrated circuit. Consequently, a tri-state encoder circuit according to this invention may be provided for each of the keys of a keyboard-type musical instrument, for example, on but a single integrated circuit chip. It will be recognized that such a tri-state encoding circuit is equally useful in conjunction with any control member or switch of such an electronic musical instrument which may assume one of three possible states. Such provision would similarly reduced the number of connecting wires which must otherwise be provided from such a member to the control circuitry of the instrument.

OBJECTS AND SUMMARY OF THE INVENTION

Accordingly, it is a general object of the invention to provide a new and improved tri-state encoding circuit for use with an electronic musical instrument.

A related object is to provide a tri-state encoding circuit which utilizes signals readily available in the electronic musical instrument for its operation.

Another object is to provide a tri-state encoding circuit which comprises relatively few and simple electronic circuit elements and which is suitable for realization as a single large scale integrated circuit.

Briefly, according to the invention a tri-state encoding circuit is provided in an electronic musical instrument which includes a player operable control means movable by the player and capable of assuming one of a plurality of control positions. A first signal source produces a first signal of predetermined frequency and duty cycle at a first one of said control positions and a second signal at a second one of said control positions, said second signal bearing a predetermined phase relationship with respect to said first signal, and means are provided for producing a predetermined signal level on said movable control means when moved to a third one of said control positions. The movable means thereby carries a control signal whose frequency and phase relationships correspond to the position thereof relative to said control positions. An output circuit means detects the signal on said movable control means and produces therefrom a digitally encoded output signal indicative of the position of the player operable control means.

BRIEF DESCRIPTION OF THE DRAWINGS

The foregoing as well as other objects, features and advantages of the present invention will become more readily appreciated upon the consideration of the following detailed description of the illustrated embodiments, together with the accompanying drawings, wherein.

DETAILED DESCRIPTION OF THE ILLUSTRATED EMBODIMENT

Figure 1:
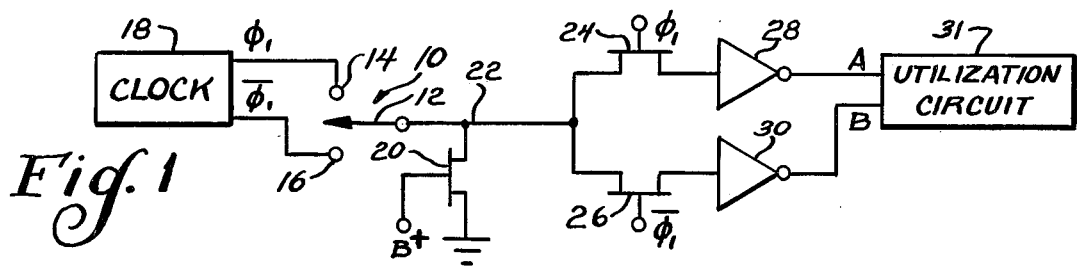
FIG. 1 illustrates a first embodiment of a tri-state encoding circuit in accordance with the present invention.

Referring initially to FIG. 1, a switch designated generally 10 is illustrated in circuit with the tri-state encoding circuit of the invention. Briefly, the switch 10 comprises a movable contact 12 which is movable between a pair of fixed contacts 14 and 16. In the illustrated embodiment, this switch 10 is a key-operated switch of a keyboard type electronic musical instrument. It will be appreciated, however, that the invention is equally applicable to any control member or switch of such an electronic musical instrument which is capable of assuming one of three possible positions. In this regard, the switch 10 may, of course, assume one of three possible positions: the movable contact 12 in contact with the fixed contact 14; the movable contact 12 in contact with the fixed contact 16, and the movable contact 12 in some position between the fixed contacts 14 and 16.

In order to electronically simulate the sound of a percussion instrument such as a piano, it is desirable to provide some signal corresponding to the intensity with which the key-operated switch 12 is actuated by the player of the instrument. Accordingly, the signals corresponding respectively to the three possible positions of the switch 10 are most useful in developing such an intensity-related signal. Thus, the tri-state encoding circuit of the invention is arranged to provide a binary encoded signal output on output lines A and B thereof as viewed in FIG. 1. As a two-bit binary signal is capable of having four possible states, it will be recognized that encoding of three states may be readily accomodated by these two output lines A and B.

The switch contacts or terminals 14 and 16 are fed signals from a suitable source such as clock 18. Preferably, these signals are readily available from a source such as clock 18 which is already part of the electronic musical instrument with which the invention is utilized. Accordingly, no additional or special provision need be made for deriving suitable signals (described later) to be utilized throughout the circuit of the invention. The signal at the contact or terminal 14 is designated $\phi_1$, while the signal at terminal 16 is designated $\bar{\phi}_1$. The signal $\phi_1$ is of a selected frequency and duty cycle, while the signal $\bar{\phi}_1$ is 180° out of phase therewith.

Accordingly, the movable contact 12 will carry either the signal $\phi_1$, the signal $\bar{\phi}_1$, or be in an open circuit (OC) condition, thus defining the three possible states of the switch 10. A source of DC potential (B+) feeds a first gating element or FET 20. This FET 20 has one terminal joined with a line 22 which is a control line received from the movable contact 12 of the switch 10. Advantageously, this single line 22 carries the necessary signals from the key switch 10 of the keyboard-type electronic musical instrument of the illustrated embodiment. It will be recognized that a common bus may be utilized to provide the same signals at the fixed contacts 14 and 16 of each such key switch or other similar three-state device of the instrument. Accordingly, a considerable savings in the time and labor associated with wiring is realized.

Referring again to the FET 20 in the embodiment of FIG. 1, the DC control voltage B+ is fed to the gate electrode thereof while the source and drain electrodes are joined with the line 22 and with ground, respectively. The line 22 also feeds respective electrodes of second and third gating elements or FET's 24 and 26. These FET's in turn feed the output lines A and B via respective inverter buffers 28 and 30. These output lines A and B feed the logic signals developed thereat to a suitable utilization circuit 31, which in the case of a percussion or piano simulation circuit generally takes the form of an envelope shaping and/or keying circuit.

The signal $\phi_1$ is also fed to the gate electrode of the FET 24 while the signal $\bar{\phi}_1$ is fed to the gate electrode of the FET 26. The FETs 24 and 26 have their respective source and drain electrodes connected to the line 22 and to the respective inverter buffers 28 and 30, respectively. Accordingly, control signals developed on the line 22 in response to the relative position of movable contact 12 and to the action of the B+ signal via FET 20, are suitably gated through by the action of the control signals $\phi_1$ and $\bar{\phi}_1$ at FETs 24 and 26. Thus, in the embodiment of FIG. 1, suitable binary encoded signals are respectively delivered by inverter buffers 28 and 30 to the output lines A and B. Table 1 below illustrates the three possible positions of switch 10 and the corresponding logic signals developed at lines A and B in response thereto by the circuit of FIG. 1.

TABLE 1

| MOVABLE CONTACT 12 AT | A | B |
|---|---|---|
| 14 | 0 | 1 |
| OC | 1 | 1 |
| 16 | 1 | 0 |

Figure 2:
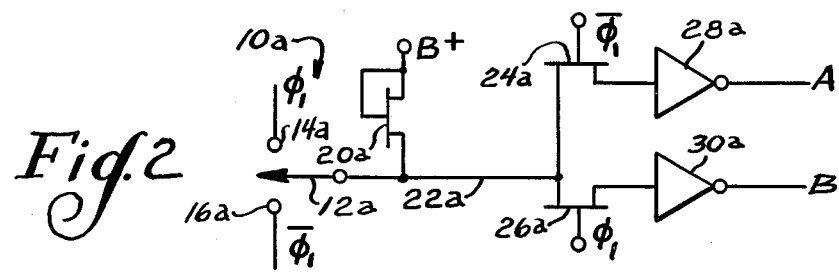
FIG. 2 illustrates a second embodiment of a tri-state encoding circuit of the invention.

A change in the logic signals provided at output lines A and B is readily accommodated by making minor changes in the circuit of FIG. 1, as is illustrated by the circuit of FIG. 2. In FIG. 2, the circuit is virtually identical with that of FIG. 1, whereby the same reference numerals are utilized, together with subscript a. Briefly, the embodiment of FIG. 2 includes a switch 10a comprising a movable contact 12a and a pair of fixed contacts 14a and 16a which receive the same signals $\phi_1$ and $\bar{\phi}_1$ as the embodiment of FIG. 1. A FET 20a receives the B+ DC control voltage at both the gate electrode and one of the source and drain electrodes thereof, the remaining electrode being fed to control line 22a. The FETs 24a and 26a have their respective source and drain electrodes connected between control line 22a and respective inverter buffers 28a and 30a, which in turn feed the respective output lines A and B. In a variation on the embodiment of FIG. 1, the signal $\bar{\phi}_1$ is fed to the gate electrode of FET 24a while the signal $\phi_1$ is fed to the gate electrode of FET 26a. Accordingly, the logic signals developed at output lines A and B are as shown in Table 2.

TABLE 2

| MOVABLE CONTACT 12a AT | A | B |
|---|---|---|
| 14a | 1 | 0 |
| OC | 0 | 0 |
| 16a | 0 | 1 |

It will be recognized that during the time the transmission gates or FETs of the circuits of FIGS. 1 and 2 are in high impedance states that the input gate capacitance of the respective inverters 28 and 30 is assumed to be sufficient to hold the outputs thereof at lines A and B steady in the respective states shown in Tables 1 and 2. This in turn depends upon the frequency of the signals $\phi_1$ and $\bar{\phi}_1$ fed to the circuits from the clock 18. If this frequency is sufficiently high, a steady state will be accomplished. If, however it is desired to use available signals from the instrument which are of a lower frequency, steady states of the output signals shown in Tables 1 and 2 may be further assured by use of a feedback loop, as shown in FIG. 3.

Figure 3:
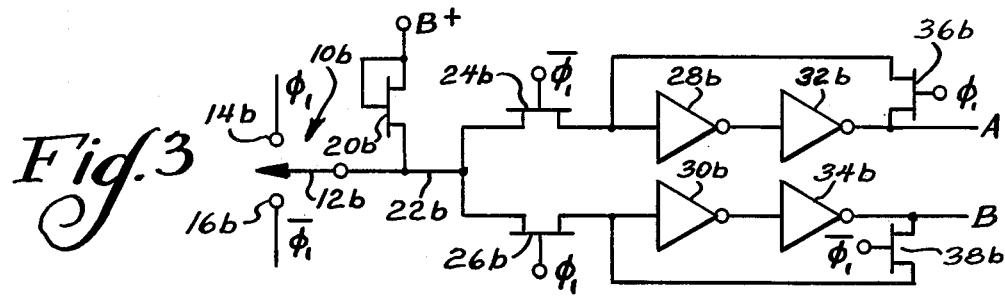
FIG. 3 illustrates a third embodiment of a tri-state encoding circuit of the invention.

Referring now to FIG. 3, the components are the same as those illustrated in FIGS. 1 and 2, and hence the same reference numerals are utilized with the subscript b. The switch 10b comprises movable contact 12b and fixed contacts 14b and 16b which receive the respective signals $\phi_1$ and $\bar{\phi}_1$. FET 20b is joined with the B+ DC control voltage and with the line 22b in the same fashion as illustrated and described for like elements 20a and 22a with reference to FIG. 2 above. Similarly, the gating elements or FETs 24b and 26b and the inverter buffers 28b and 30b have the same interconnections as the like elements 24a, 26a, 28a, and 30a, illustrated and described above with reference to FIG. 2. To accomplish a suitable feedback control signal for each of the output lines A and B, a similar circuit is utilized. Respective inverter buffers 32b and 34b are interposed in the respective output lines A and B at the outputs of the inverter buffers 28b and 30b, respectively. Each of these further inverter buffers 32b, 34b feeds one of the source or drain electrodes of a respective further gating element or FET 36b, 38b. These FETs 36b, 38b receive the control signals $\phi_1$ and $\overline{\phi}_1$ at their gate electrodes and have their respective remaining electrodes (source or drain) tied to the respective inputs of inverter buffers 28b and 30b to complete their respective feedback loops. Specifically, the signal $\phi_1$ feeds the gate electrode of FET 36b, while control signal $\overline{\phi}_1$ feeds the gate electrode of FET 38b.

Figure 4:
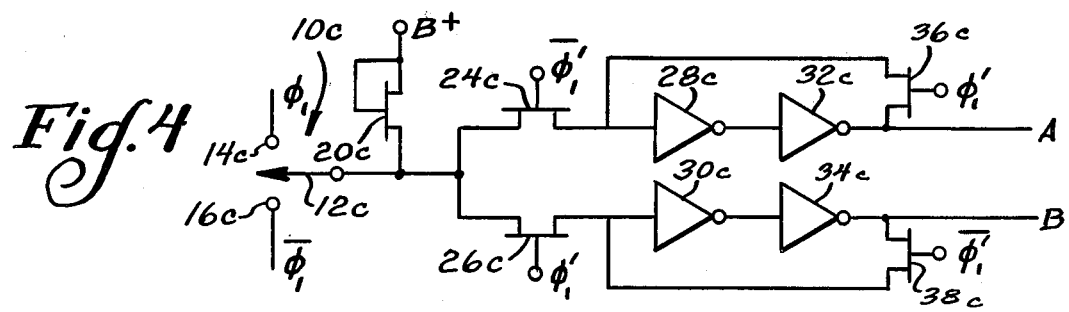
FIG. 4 illustrates a fourth embodiment of a tri-state encoding circuit in accordance with the invention.

A further problem often encountered in such an electronic musical instrument is that of obtaining suitable clock phasing between the signals $\phi_1$ and $\overline{\phi}_1$ as they are fed to various points in the illustrated circuits. Accordingly, FIG. 4 illustrates a further variation to the circuits of the invention for avoiding such problems in maintaining proper clock phasing. In the embodiment of FIG. 4, the components are all the same as described above with reference to the earlier Figs., therefore the same reference numerals are used throughout with the subscript c. The circuit of FIG. 4 is identical with the circuit of FIG. 3, with the exception of the identity of the control signals feeding the gate electrodes of the FETs 24c, 26c, 36c and 38c. In the embodiment of FIG. 4 these signals are as follows: a signal $\phi_1'$ feeds the respective gate electrodes of FETs 26c and 36c, while a signal $\overline{\phi}_1'$ feeds the gate electrodes of FETs 24c and 38c. Preferably, the signal $\phi_1'$ is a related duty cycle of the signal $\phi_1$, while the signal $\overline{\phi}_1'$ is 180° out of phase with the signal $\phi_1'$.

Figure 5:
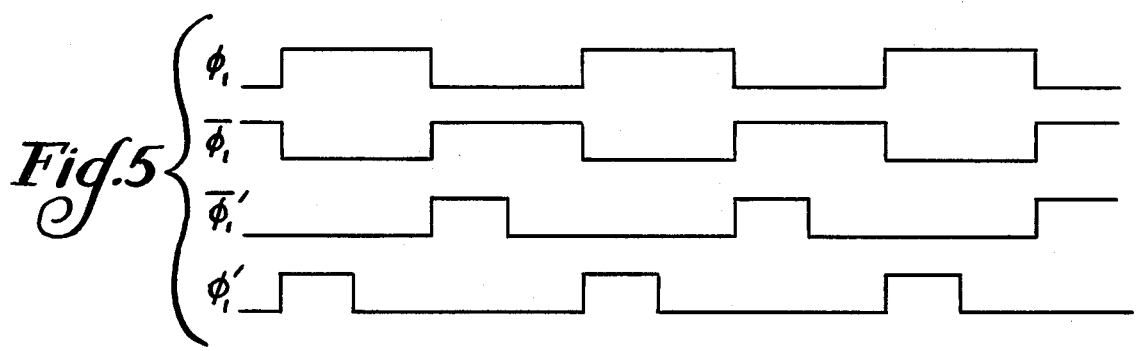
FIG. 5 is a waveform diagram illustrating signals utilized in the tri-state encoding circuit of the invention

Referring briefly to FIG. 5, exemplary waveforms are illustrated for the respective control signals $\phi_1$, $\overline{\phi}_1$, $\phi_1'$ and $\overline{\phi}_1'$, as described above. As a specific example to which no limitation is intended, the signal $\phi_1$ may be on the order of 30 kilohertz at a 50% duty cycle, the signal $\overline{\phi}_1$ being 180° out of phase therewith. Thus, the signal $\phi_1'$ is at the same frequency (30 kilohertz) at a 25% duty cycle, the signal $\overline{\phi}_1'$ being 180° out of phase therewith.

While specific embodiments have been illustrated and described herein the invention is not limited thereto. On the contrary, various modifications, changes and alternatives may occur to those skilled in the art, and the invention includes such changes, modifications and alternatives insofar as they fall within the spirit and scope of the appended claims.

The invention is claimed as follows:

1. In an electronic musical instrument having player operable control means movable by the player and capable of assuming one of a plurality of control positions, a tri-state encoder circuit for producing a digitally encoded output signal corresponding to the relative position of the movable control means, said tri-state encoder circuit comprising: a first signal source for producing a first signal of predetermined frequency and duty cycle at a first one of said control positions and a second signal at a second one of said control positions, said second signal bearing a predetermined phase relationship with respect to said first signal, means for producing a predetermined signal level on the movable control means when moved to a third one of said control positions, said movable control means thereby carrying a signal whose frequency and phase relationships correspond to the position of the movable control means relative to said control positions, and output circuit means for detecting the signal on said movable control means and producing therefrom said digitally encoded output signal corresponding to the relative position of the movable control means.

2. In an electronic musical instrument having player operable control means movable by the player to one of a first position, a second position and a third position, a tri-state encoder circuit for producing a binary encoded output signal corresponding to the relative position of the movable control means, said tri-state encoder circuit comprising: a first signal source producing a first signal of predetermined frequency and duty cycle at said first control position and a second signal at said second control position, said second signal being of a predetermined frequency and duty cycle and bearing a predetermined phase relationship with respect to said first signal, means for producing a predetermined signal level on the movable control means when moved to said third control position, said movable control means thereby carrying a control signal corresponding to the position thereof relative to said first, second and third control positions, a second signal source producing a third signal at the same frequency as said first signal and having a predetermined duty cycle and a fourth signal of predetermined frequency and duty cycle and bearing a predetermined phase relationship with respect to said third signal, first and second outputs, gate means responsive to said third signal for controlling the application of said control signal to said first output and second gate means responsive to said fourth signal for controlling the application of said control signal to said second output, said first and second outputs thereby providing said binary encoded output signal.

3. A tri-state encoder circuit according to claim 2 wherein said means for producing a predetermined signal level on the movable control means when moved to said third control position comprises a biasing signal and third gate means in circuit with said biasing signal and with said movable contact.

4. A tri-state encoder circuit according to claim 2 wherein said second signal is of the same frequency and duty cycle as the first signal, but 180° out of phase therewith.

5. A tri-state encoder circuit according to claim 2 or claim 4 wherein said fourth signal is of the same frequency and duty cycle as said third signal but 180° out of phase therewith.

6. In an electronic musical instrument having player operable control means movable by the player to one of a first position, a second position and a third position, a tri-state encoder circuit for producing a binary encoded output signal corresponding to the relative position of the movable control means, said tri-state encoder circuit comprising: a first signal source producing a first signal of predetermined frequency and duty cycle at said first control position and a second signal at said second control position, said second signal being 180° out of phase with said first signal, means for producing a predetermined signal level on the movable control means when in said third control position and comprising a source of biasing signal and first gate means in circuit between said biasing signal and said movable control means, said movable control means thereby carrying a control signal corresponding to the position thereof relative to said first, second and third control positions, a second signal source producing a third signal at the same frequency as said first signal and having a predetermined duty cycle and a fourth signal 180° out of phase with said third signal, first and second outputs, second gate means responsive to said third signal for controlling the application of said control signal to said first output and third gate means responsive to said fourth signal for controlling the application of said control signal to said second output, said first and second outputs thereby providing said binary encoded output signal.

7. A tri-state encoder circuit according to claim 2 or claim 2 further including first and second output buffer means interposed respectively in said first and second outputs.

8. A tri-state encoder circuit according to claim 7 further including first and second feedback gate means forming respective first and second feedback loops around the respective output buffer means in the first and second outputs, each of said feedback gate means being responsive to one of said third and fourth signals for producing feedback signals in the first and second feedback loops, respectively.

9. A tri-state encoder circuit according to claim 6 or claim 3 wherein said biasing signal is a predetermined DC voltage.

10. A tri-state encoder circuit according to claim 2 or claim 6 wherein the third signal has the same predetermined duty cycle as the first signal.

11. A tri-state encoder circuit according to claim 10 wherein the third signal is in phase with the first signal.

12. A tri-state encoder circuit according to claim 11 wherein the biasing signal is a predetermined DC voltage.

13. A tri-state encoder circuit according to claim 8 wherein said first feedback gate means is responsive to the fourth signal and the second feedback gate means is responsive to the third signal.

* * * * *

UNITED STATES PATENT AND TRADEMARK OFFICE
CERTIFICATE OF CORRECTION

PATENT NO. : 4,207,792
DATED : June 17, 1980
INVENTOR(S) : WILLIAM R. HOSKINSON

It is certified that error appears in the above—identified patent and that said Letters Patent are hereby corrected as shown below:

Column 7, line 15, change "Claim 2" to --Claim 6--.

Signed and Sealed this

Fourth Day of November 1980

[SEAL]

Attest:

SIDNEY A. DIAMOND

Attesting Officer

Commissioner of Patents and Trademarks